(12) United States Patent
Lee

(10) Patent No.: US 7,233,533 B2
(45) Date of Patent: Jun. 19, 2007

(54) METHOD FOR CONTROLLING DATA OUTPUT TIMING OF MEMORY DEVICE AND DEVICE THEREFOR

(75) Inventor: Dong Uk Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 12 days.

(21) Appl. No.: 11/153,970

(22) Filed: Jun. 16, 2005

(65) Prior Publication Data
US 2006/0120207 A1 Jun. 8, 2006

(30) Foreign Application Priority Data
Dec. 3, 2004 (KR) .................. 10-2004-0101261

(51) Int. Cl.
*G11C 7/00* (2006.01)

(52) U.S. Cl. ................. 365/194; 365/193; 365/189.004

(58) Field of Classification Search ................. 365/194
See application file for complete search history.

(56) References Cited

U.S. PATENT DOCUMENTS 6,510,503 B2 * 1/2003 Gillingham et al. ........ 711/167
2005/0122796 A1 * 6/2005 Jung et al. .................. 365/194

* cited by examiner

*Primary Examiner*—Thong Q. Le
(74) *Attorney, Agent, or Firm*—Ladas & Parry LLP

(57) ABSTRACT

Disclosed is a device for controlling data output of a memory device using a DLL clock signal, the device comprising: an output driver for outputting data; and a CAS latency control unit for generating a signal adjusting an operation timing of the output driver depending on CAS latency, wherein the CAS latency control unit generates a signal for controlling the output driver by using time difference between the DLL clock signal and an external clock applied to the memory device from an exterior.

7 Claims, 8 Drawing Sheets

METHOD FOR CONTROLLING DATA OUTPUT TIMING OF MEMORY DEVICE AND DEVICE THEREFOR

BACKGROUND OF THE INVENTION

1. Field of the Invention

The present invention relates to a method and device for controlling CAS latency, and more particularly to a method and device for precisely controlling a data output timing of the next-generation Double Data Rate (DDR) SDRAM.

2. Description of the Prior Art

As generally known in the art, the higher the operational frequency of a memory device is, the higher the data input/output speeds of the memory device are. However, since a synchronous memory device receives/outputs data in synchronization with a clock signal, the increase of its operational frequency may cause a problem in synchronizing a data input/output timing with a clock signal.

FIG. 1 is a block diagram schematically illustrating the data output control section of a conventional DDR SDRAM.

As shown in FIG. 1, the data output control section includes an internal signal generation unit 110, a CAS latency control unit 120, an output driver 130 and a DLL circuit 140.

The internal signal generation unit 110 receives signals CK,/CS,/RAS,/CAS,/WE etc., applied from an exterior, and generates an internal clock signal clkpd and internal command signals readp and bstendbp which are used in the memory device. Herein, the internal clock signal clkpd is a signal obtained by buffering an external clock signal CK, and 'clkpd' is an abbreviation for 'clock pulse _delayed'. From among the internal command signals, signal 'readp' is a signal generated by a read command applied from an exterior and is enabled to a high level when such a read command is applied to the internal signal generation unit 110, and signal 'bstendbp' represents the end of read and is generated when a burst ends. For reference, 'readp' is an abbreviation for 'read pulse', and 'bstendbp' is abbreviation for 'burst end bar pulse'.

The CAS latency control unit 120 generates an output enable control signal suitable to a CAS latency by combining an output signal of the internal signal generation unit 110 and a DLL clock signal dllclkp outputted from the DLL circuit 140. In the following description, an output signal of the DLL circuit 140 is called a DDL clock signal.

The DLL circuit 140 used in a synchronous memory device is a circuit for generating a DLL clock signal dllclkp, and the DLL clock signal dllclkp functions to synchronize a data output timing with an external clock signal CK.

The output driver 130 stores data outputted to an exterior. The output driver 130 outputs stored data to an exterior in synchronization with an DLL clock signal dllclkp while the output enable control signal is enabled to a high level.

For reference, in FIG. 1, 'tDA' represents a time period delayed until an output signal of the internal signal generation unit 110 arrives at the CAS latency control unit 120, and 'tDD' represents a time period delayed until an output signal of the DLL circuit 140 arrives at the CAS latency control unit 120.

The entire operation of the circuit shown in FIG. 1 is as follows.

When a read command is issued, data read from a memory cell array is stored in the output driver. The data stored in the output driver are outputted to an exterior in synchronization with the clock edge of a DLL clock signal dllclkp while the output enable control signal of the CAS latency control unit is enabled to a high level. The end of a read operation is controlled by a burst end signal.

FIG. 2 is a block diagram illustrating a conventional CAS latency control unit shown in FIG. 1.

The CAS latency control unit shown in FIG. 2 includes a read operation control unit 210 and a data output control signal generation unit 220.

The read operation control unit 210 controls a read operation, and outputs an internal read command signal rd_cmd and a control signal yout. The internal read command signal rd_cmd is a signal for enabling a read operation in the memory device, and the control signal yout is a signal for controlling the operation of the data output control signal generation unit 220.

The data output control signal generation unit 220 receives the control signal yout to generate output enable control signals oe10 to oe50 for adjusting a data output timing. The output enable control signals oe10 to oe50 include information about CAS latency. Therefore, from among the output enable control signals oe10 to oe50, one output enable control signal corresponding to CAS latency is outputted to be applied to the output driver 130 shown in FIG. 1.

For reference, the output signals oe10 to oe50 of the data output control signal generation unit 220 in FIG. 2 correspond to the output enable control signals of the CAS latency control unit 120 in FIG. 1.

FIG. 3 is a waveform view for explaining the operation of the CAS latency control unit shown in FIG. 2.

In FIG. 3, 'tRD' represents a delay time from when a read command is applied in synchronization with the rising edge of an external clock signal CK, to when the application of the read command is recognized to generate a signal readp in the memory device. As described with reference to FIG. 1, 'tDA' represents a delay time from when an output signal of the internal signal generation unit 110 is outputted to when the output signal of the internal signal generation unit 110 arrives at the CAS latency control unit 120, and 'tDD' represents a delay time from when an output signal of the DLL circuit 140 is outputted to when the output signal of the DLL circuit 140 arrives at the CAS latency control unit 120. Also, 'tCMD' represents a delay time from when a read command is applied in synchronization with the rising edge of an external clock signal to when an internal read command rd_cmd is generated. In shown in FIG. 3, delay time 'tCMD' occurs in synchronization with the rising edge of signal 'readp'. Finally, 'tDO' represents a time difference between the external clock signal CK and the DLL clock signal dllclkp.

In FIG. 3, an output enable control signal OE10 is a signal enabled when the CAS latency is '2', an output enable control signal OE20 is a signal enabled when the CAS latency is '3', an output enable control signal OE30 is a signal enabled when the CAS latency is '4', an output enable control signal OE40 is a signal enabled when the CAS latency is '5', and an output enable control signal OE50 is a signal enabled when the CAS latency is '6'.

The data output operation will now be described with reference to FIG. 3.

When a read command is applied from an exterior, an internal read command rd_cmd is enabled after a predetermined period of time elapses.

Next, the CAS latency control unit shown in FIG. 2 generates an output enable signal (e.g., OE10) corresponding to the CAS latency.

Then, while the output enable signal (OE10) is enabled, the output driver (see reference number '130' in FIG. 1) outputs stored data to an exterior in synchronization with the DLL clock signal dllclkp.

Thereafter, when the burst end signal bstendbp is shifted into a low level, the read operation ends.

The above-mentioned data output operation is described for the case in which the CAS latency is '2'. When the frequency of the external clock signal CK has a high value, another output enable signal OE30, OE40, etc. to adjust the output timing.

However, as shown in FIG. 3, in order for an DLL clock signal dllclkp generated by the DLL circuit to latch the internal read command rd_cmd, it is necessary to satisfy the following condition:

$tCMD < tCK - tDO + tDD.$

Herein, 'tCK' represents the period of an external clock signal CK.

Since the conventional synchronous memory device which uses an external clock signal having a frequency lower than 500 MHz meets with the above-mentioned condition, a difficulty does not lie in adjusting the data output timing.

However, in the case in which the operational frequency of an external clock signal exceeds 500 MHz, the phase difference between the external clock signal CK and the DLL clock signal dllclkp becomes very small. Furthermore, recent high-speed memory devices have a relation such as 'tCMD+tDO−tDD>tCK', which means that it is impossible to properly adjust the data output timing depending on the CAS latency. Accordingly, when the operational frequency of an external clock signal exceeds 500 MHz, the data output operation may malfunction.

SUMMARY OF THE INVENTION

Accordingly, the present invention has been made to solve the above-mentioned problems occurring in the prior art, and an object of the present invention is to provide a method which can achieve stable read operation even in high-speed memory devices.

Another object of the present invention is to provide a method which senses a phase difference between an external clock signal and a DLL clock signal generated from a DLL circuit, thereby performing data output depending on CAS latency.

In accordance with a first aspect of the present invention in order to accomplish the above objects, there is provided a method for controlling data output of a memory device using a DLL clock signal, the method comprising the steps of: calculating a delay difference between the DLL clock signal and an external clock applied to the memory device from an exterior; and controlling an output timing of data outputted from the memory device by using the delay difference.

In accordance with a second aspect of the present invention, there is provided a method for controlling data output of a memory device using a DLL clock signal, the method comprising the steps of: outputting a plurality of first control signals for controlling an output timing of data; calculating a delay difference between the DLL clock signal and an external clock applied to the memory device from an exterior; generating a second control signal which represents a degree of the delay difference; generating a plurality of third control signals by delaying the plurality of first control signals in response to the second control signal; and selecting one of the third control signals depending on CAS latency of the memory device.

In accordance with a third aspect of the present invention, there is provided a device for controlling data output of a memory device using a DLL clock signal, the device comprising: an output driver for outputting data; and a CAS latency control unit for generating a signal adjusting an operation timing of the output driver depending on CAS latency, wherein the CAS latency control unit generates a signal for controlling the output driver by using time difference between the DLL clock signal and an external clock applied to the memory device from an exterior.

Preferably, the CAS latency control unit comprises: a read command control unit for a first control signal and a second control signal, the first control signal being internally activated by a read command applied in synchronization with a rising edge of the external clock, the second control signal being generated in synchronization with a rising edge of the DLL clock signal which is generated for the first time after the first control signal has been activated; a delay unit for outputting a third control signal obtained by delaying the second control signal by a predetermined period of time; a count signal generation unit for outputting a fourth control signal and a fifth control signal, the fourth control signal having a pulse width to be enabled at a rising edge of the first control signal and to be disabled at a rising edge of the third control signal, the fifth control signal counting the number of rising edges of the external clock during an enable period of the fourth control signal; a control unit for outputting a plurality of control signals by using the fourth and fifth control signals; and a data output control signal generation unit for receiving the second control signal and outputting a plurality of output enable signals. Herein, the first and second control signals and the plurality of output enable signals have an equal pulse width, and one of the control signals outputted from the control unit is selected to select one of the output enable signals.

Herein, selecting one of the output enable signals is determined depending on the CAS latency of the memory device.

Herein, the plurality of output enable signals are sequentially generated in synchronization with rising edges of the DLL clock signal, and delay of a time point for generating the selected output enable signal increases as the CAS latency of the memory device increases.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Figure 1:
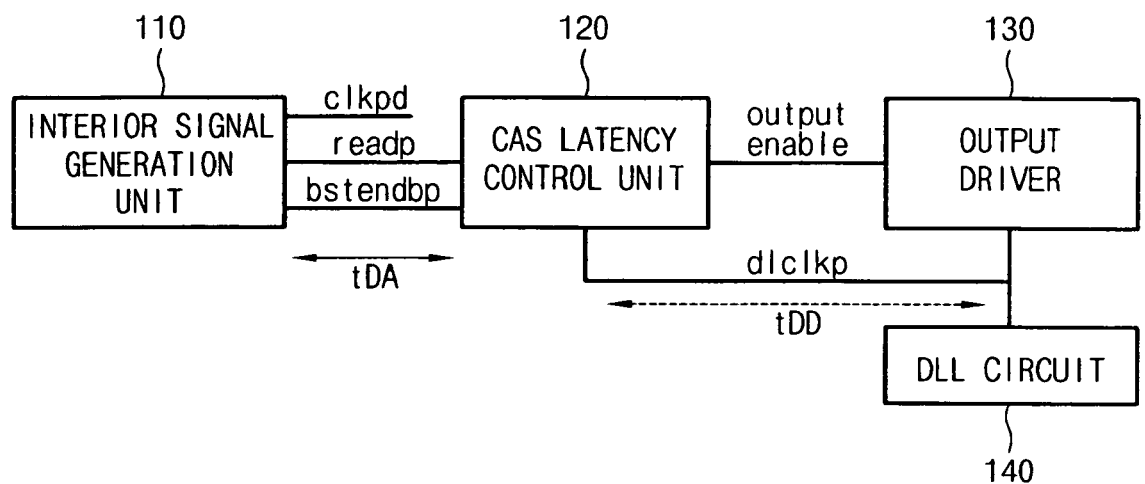
FIG. 1 is a block diagram schematically illustrating the data output control section of a conventional DDR SDRAM.

Hereinafter, a preferred embodiment of the present invention will be described with reference to the accompanying drawings. In the following description and drawings, the same reference numerals are used to designate the same or similar components, and so repetition of the description on the same or similar components will be omitted. For reference, the basic configuration that of a data output control section described with reference to FIG. 1 is identically applied to a data output control section according to the present invention. The present invention is characterized by a CAS latency control unit. Therefore, the following description with reference to FIGS. 5 to 9 will be focused on the CAS latency control unit.

Figure 4A:
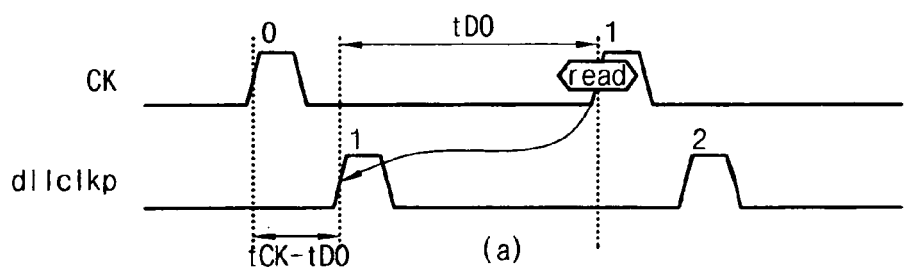
FIGS. 4A and 4B are waveform diagrams for explaining the concept of the present invention.
Figure 4B:
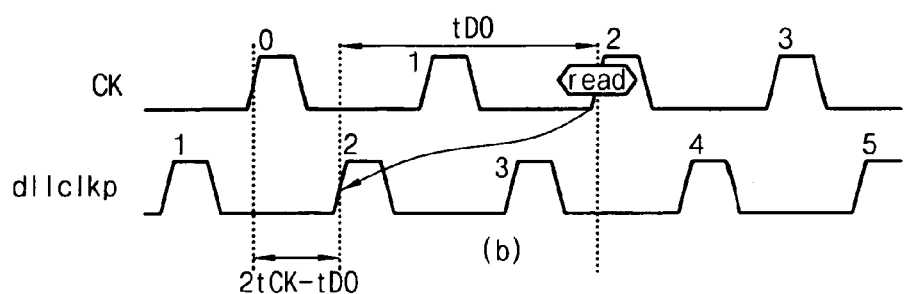

FIGS. 4A and 4B are waveform views for explaining the concept of the present invention.

FIG. 4A shows waveforms for the case in which the external clock signal has a low value, that is, the case in which a condition of '0<tDO<tCK' is satisfied. FIG. 4B shows waveforms for the case in which the external clock signal has a high value, that is, the case in which a condition of 'tCK≦tDO<2tCK' is satisfied.

From the waveforms shown in FIGS. 4A and 4B, the general conditions may be derived as follows.

As shown in FIG. 4A, when tDO<tCK, the delay time between an external clock signal CK and a DLL clock signal dllclkp may be expressed as 'tDO−tCK'.

Also, as shown in FIG. 4B, when (n−1)*tCK<tDO<n*tCK, the delay time between an external clock signal CK and a DLL clock signal dllclkp may be expressed as 'n*tCK−tDO'.

The present invention, which is proposed in consideration of the above-mentioned conditions, provides a method which detects the value of n representing a degree of delay time between an external clock signal CK and a DLL clock signal dllclkp and then reflects the detected value of n in the CAS latency control unit. For example, FIG. 4B shows waveforms for the case in which n is '2'. The value of n is detected by a counter circuit, which will be described in detail with reference to FIGS. 5 to 9.

Figure 5:
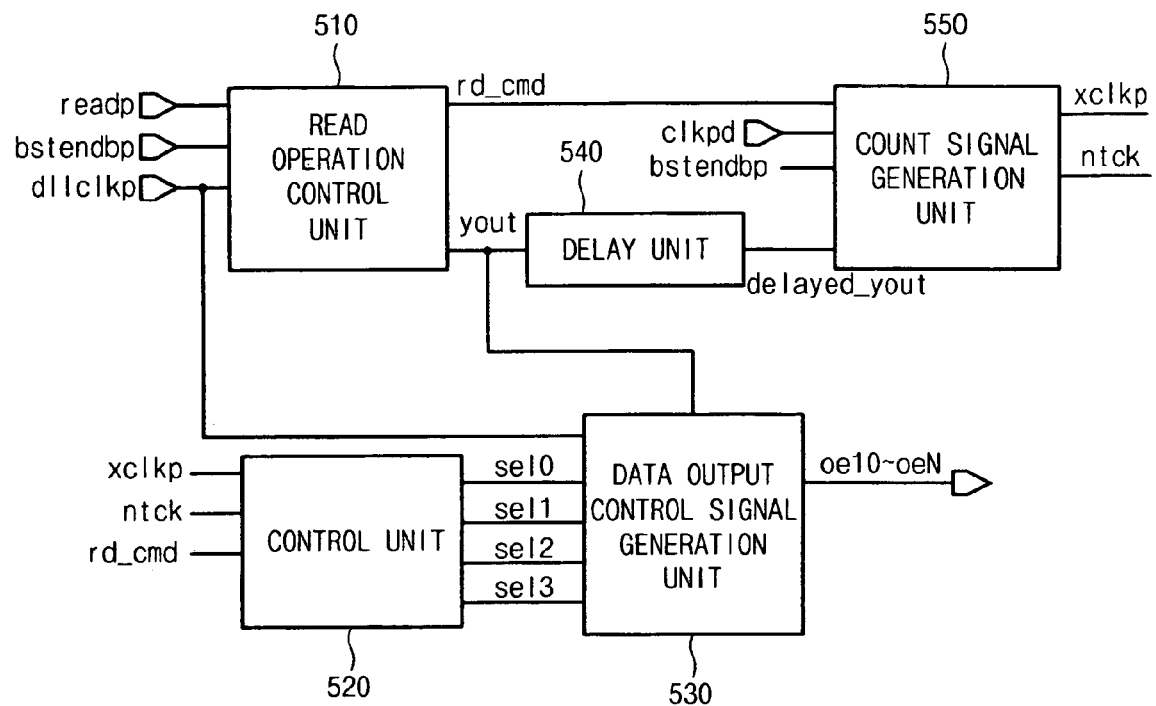
FIG. 5 is a block diagram illustrating the configuration of a CAS latency control unit according to an embodiment of the present invention.

FIG. 5 is a block diagram illustrating the configuration of a CAS latency control unit according to an embodiment of the present invention.

Figure 2:
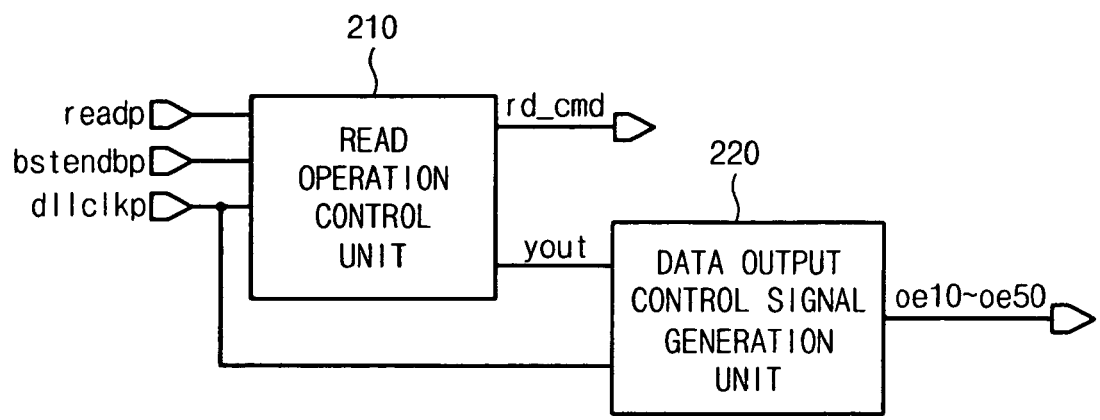
FIG. 2 is a block diagram illustrating a conventional CAS latency control unit shown in FIG. 1.
Figure 3:
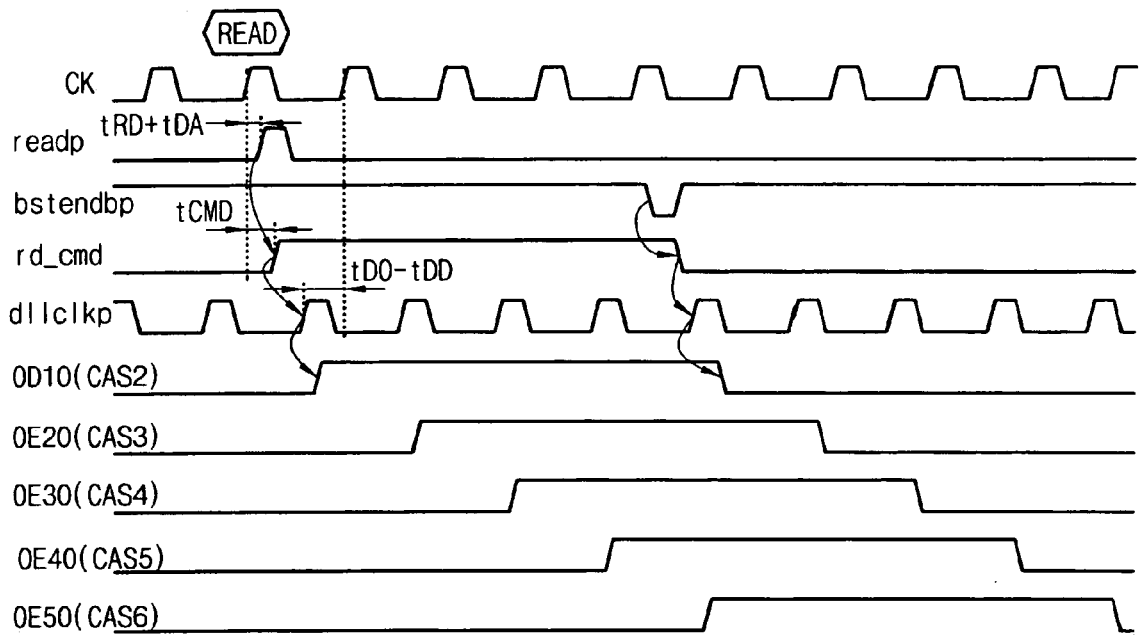
FIG. 3 is a waveform view for explaining the operation of the CAS latency control unit shown in FIG. 2.

The CAS latency control unit shown in FIG. 5 includes a read operation control unit 510, a control unit 520, a data output control signal generation unit 530, a delay unit 540 and a count signal generation unit 550. Differently from the conventional CAS latency control unit shown in FIG. 2, the CAS latency control unit according to an embodiment of the present invention further includes the control unit 520, the delay unit 540 and the count signal generation unit 550.

In FIG. 5, the read operation control unit 510 controls a read operation, and outputs an internal read command signal rd_cmd and a control signal yout. The internal read command signal rd_cmd is a signal for enabling a read operation in the memory device, and the control signal yout is a signal for controlling the operation of the data output control signal generation unit 530.

The delay unit 540 delays the output signal yout of the read operation control unit 510 by a predetermined period of time. The delay time caused by the delay unit 540 is approximately "TDO+tRD+tDA−tDD".

The count signal generation unit 550 receives an internal read command rd_cmd, an internal clock signal clkpd, a burst end signal bstendbp and a delayed signal delayed_yout. Herein, the internal clock signal clkpd is a signal obtained by buffering and delaying an external clock signal CK, and the burst end signal bstendbp is a signal representing the end of a read operation. Output signals xclkp and ntck of the count signal generation unit 550 are applied to the control unit 520. A detailed embodiment of the count signal generation unit 550 will be described later with reference to FIG. 7.

The control unit 520 receives the signals xclkp, ntck and rd_cmd, and outputs a plurality of control signals se10, se11, se12 and se13. A detailed embodiment of the control unit 520 will be described later with reference to FIG. 8.

The data output control signal generation unit 530 receives the signals se10, se11, se12, se13, dllclkp and yout, and generates output enable control signals oe10 to oeN which adjust the output timing of data stored in the output driver 130 shown in FIG. 1. The output enable control signals oe10 to oeN include information about CAS latency. Therefore, from among the output enable control signals oe10 to oeN, one output enable control signal corresponding to the CAS latency is outputted to applied to the output driver 130 shown in FIG. 1. A detailed embodiment of the data output control signal generation unit 530 will be described later with reference to FIG. 9.

Figure 6:
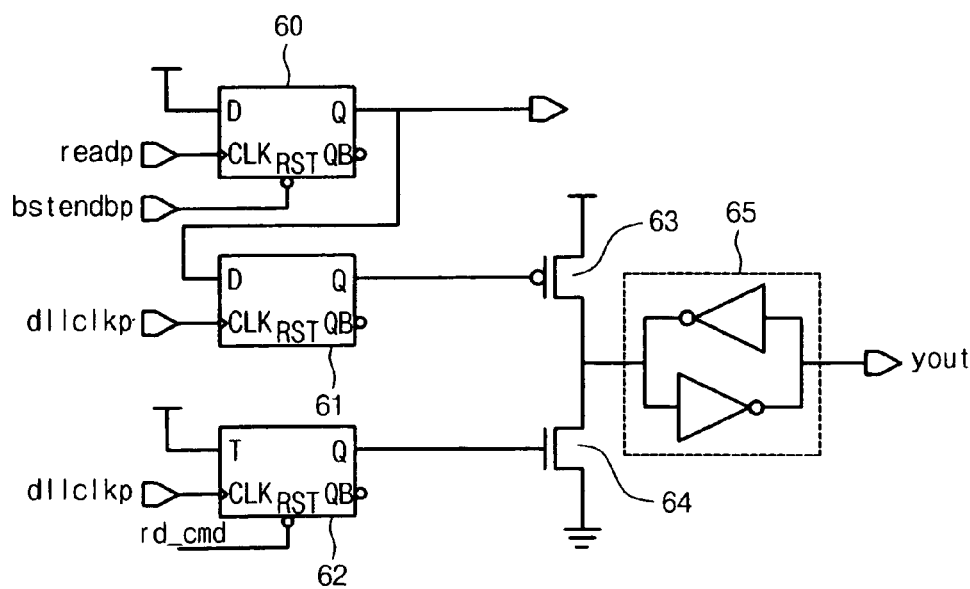
FIG. 6 is a circuit diagram illustrating the configuration of a read operation control unit shown in FIG. 5 according to an embodiment of the present invention.

FIG. 6 is a circuit diagram illustrating the configuration of the read operation control unit shown in FIG. 5 according to an embodiment of the present invention.

The read operation control unit shown in FIG. 6 includes D flip-flops 60 and 61, a T flip-flop 62, a pull-up driver 63, a pull-down driver 64, and a latch unit 65.

In operation, the D flip-flop 60 generates an internal read command rd_cmd, which is a level signal, by using signals readp and bstendbp, which are pulse signals.

While the internal read command rd_cmd is maintained at a high level, the D flip-flop 61 controls the pull-up driving unit 63 by a DLL clock signal dllclkp.

The T flip-flop 62 controls the pull-down driver by a signal obtained by toggling the DLL clock signal dllclkp.

As shown in FIG. 6, the internal read command rd_cmd is synchronized with the signal readp, and the output signal yout of the latch unit 65 is synchronized with the DLL clock signal dllclkp.

Figure 7:
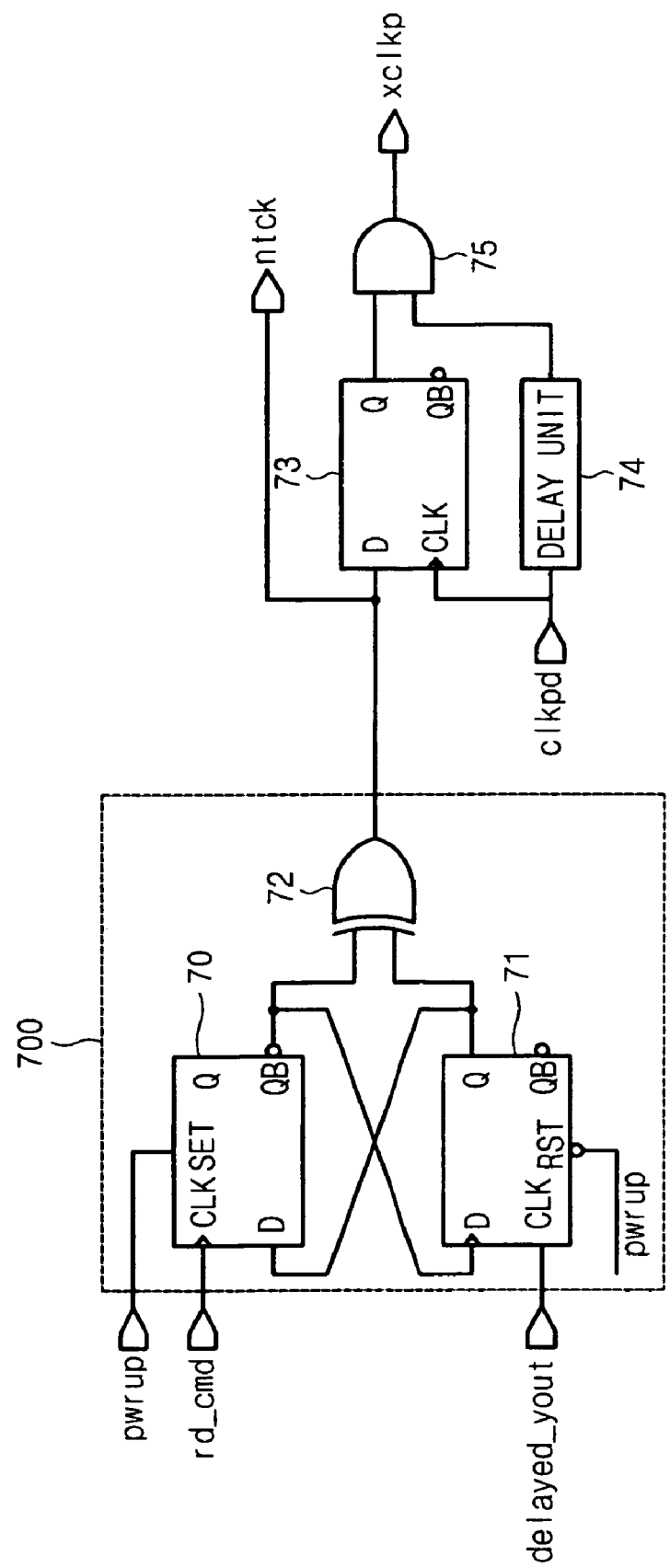
FIG. 7 is a circuit diagram illustrating the configuration of a count signal generation unit shown in FIG. 5 according to an embodiment of the present invention.

FIG. 7 is a circuit diagram illustrating the configuration of the count signal generation unit shown in FIG. 5 according to an embodiment of the present invention.

The count signal generation unit shown in FIG. 7 includes a 2-state phase detector 700, a D flip-flop 73, a delay unit 74 and an AND gate 75.

The 2-state phase detector 700 includes D flip-flops 70 and 71, and exclusive-OR gate 72. The 2-state phase detector 700 detects a time difference between rising edges of an internal read command rd_cmd and a delayed signal delayed_yout.

Herein, the internal read command rd_cmd is delayed by tRD+tDA+tDFF on the basis of an external clock signal CK. For reference, 'tDFF' represents a delay time of the D flip-flop.

A signal yout is delayed by n*tCK−tDO+tDFF+tDD on the basis of an external clock signal CK. Herein, n is an integer which represents how many times the DLL clock signal dllclkp is toggled while the internal read command rd_cmd is in an enable state. Since a delay time caused by the delay unit 540 is tDO+tRD+tDA−tDD, the delayed signal delayed_yout is delayed by n*tCK+tDFF+tRD+tDA on the basis of the external clock signal CK. Herein, n is an integer representing the 'n' of an $n^{th}$ DLL clock signal dllclkp, which is initially met by the rising edge of an external clock signal CK synchronized with an read command rd_cmd after a DLL clock signal dllclkp corresponding to the external clock signal CK synchronized with the read command rd_cmd occurs.

For example, in FIG. 4A, when a read command is applied in synchronization with the rising edge of the external clock signal CK indicated by #1, a DLL clock signal dllclkp having a negative delay by 'tDO' is rising at a time point indicated by #1. In FIG. 4A, the DLL clock signal dllclkp initially occurring after a read command synchronized with an external clock signal CK is applied is indicated by #2. The DLL clock signal dllclkp indicated by #2 is a DLL clock signal initially occurring after the read command synchronized with an external clock signal is applied. That is, FIG. 4A shows waveforms for the case of 'n=1'.

FIG. 4B shows waveforms for the case in which an external clock signal has a high frequency.

As shown in FIG. 4B, when a read command is applied in synchronization with the rising edge of the external clock signal CK indicated by #2, a DLL clock signal dllclkp having a negative delay by 'tDO' is rising at a time point indicated by #2. In FIG. 4A, the DLL clock signal dllclkp initially occurring after a read command synchronized with an external clock signal CK is applied is indicated by #4. The DLL clock signal dllclkp indicated by #4 is a DLL clock signal occurring for the second time after the read command synchronized with an external clock signal is applied. Therefore, FIG. 4B shows waveforms for the case of 'n=2'.

An output signal ntck of the 2-state phase detector 700 is a pulse signal, the pulse width of which is a time difference between the rising edge of the internal read command rd_cmd and the rising edge of the delayed signal delayed_yout, which are input signals. In this case, the pulse width of the pulse signal ntck is n*tCK (see FIG. 10).

Figure 10:
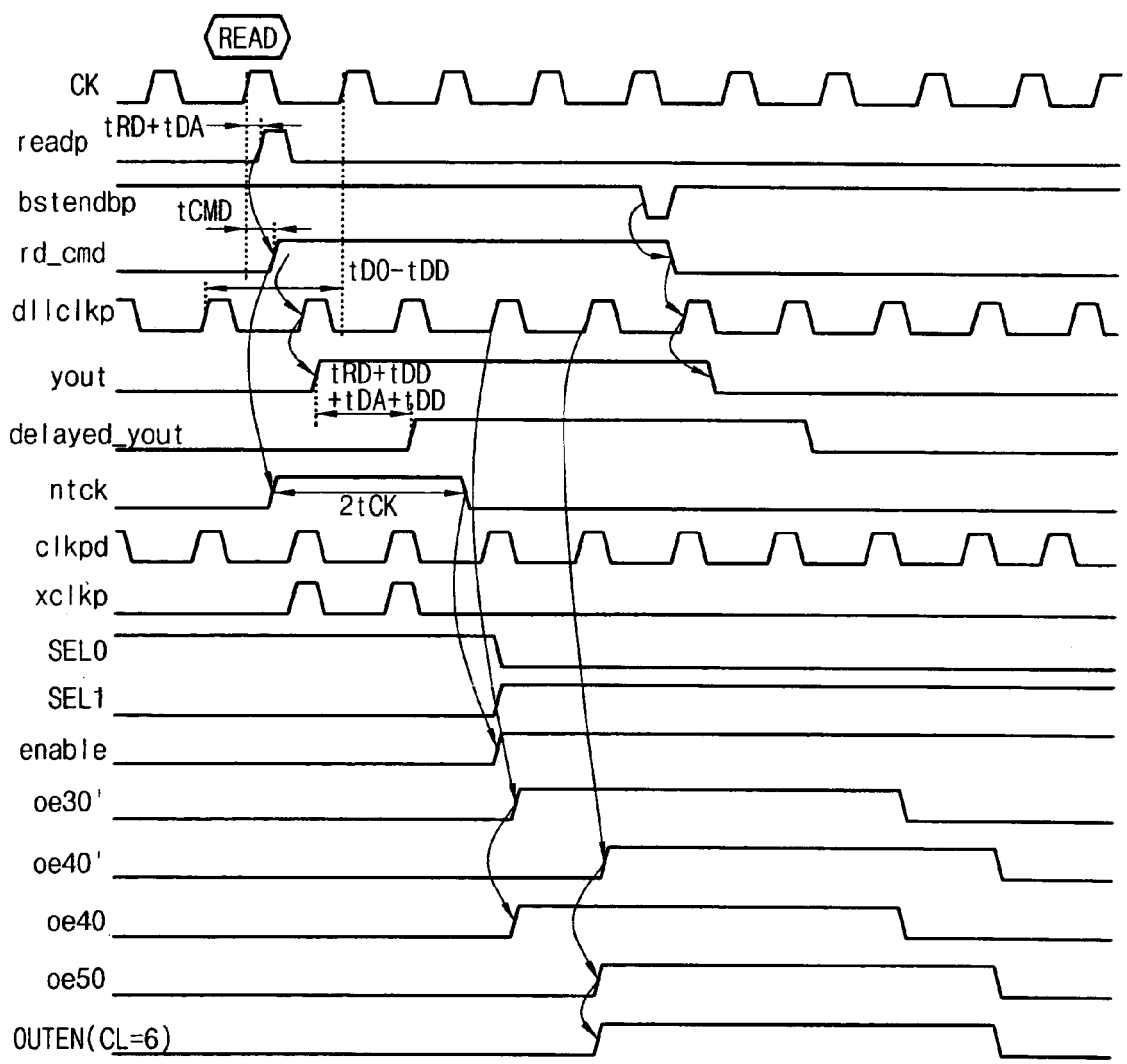
FIG. 10 is a waveform diagram illustrating waveforms of an output enable signal depending on the CAS latency.

Referring again to FIG. 7, the D flip-flop 73 receives and outputs an internal clock signal clkpd while the signal ntck is enabled at a high level. Also, the internal clock signal clkpd passes through the delay unit 74. The AND gate 75 adds an output signal of the D flip-flop 73 and an output signal of the delay unit 74. An output signal of the AND gate 75 is xclkp (see FIG. 10). As shown in FIG. 10, the signal xclkp detects the number of clocks of an external clock signal CK occurring while the signal 'ntck' is enabled. FIG. 10 shows waveforms for the case in which the number of clocks is '2', that is, n=2.

In FIG. 7, a power-up signal pwrup has a high level when a DRAM operates, and has a low level in an initial state of the DRAM. The D flip-flop 70 is in a SET state when the power-up signal pwrup has a high level. In this case, an output node Q of the D flip-flop 70 has a high level and an output node QB of the D flip-flop 70 has a low level. In contrast, The D flip-flop 71 is in a RESET state when the power-up signal pwrup has a high level. In this case, an output node Q of the D flip-flop 71 has a low level and an output node QB of the D flip-flop 70 has a high level.

Figure 8:
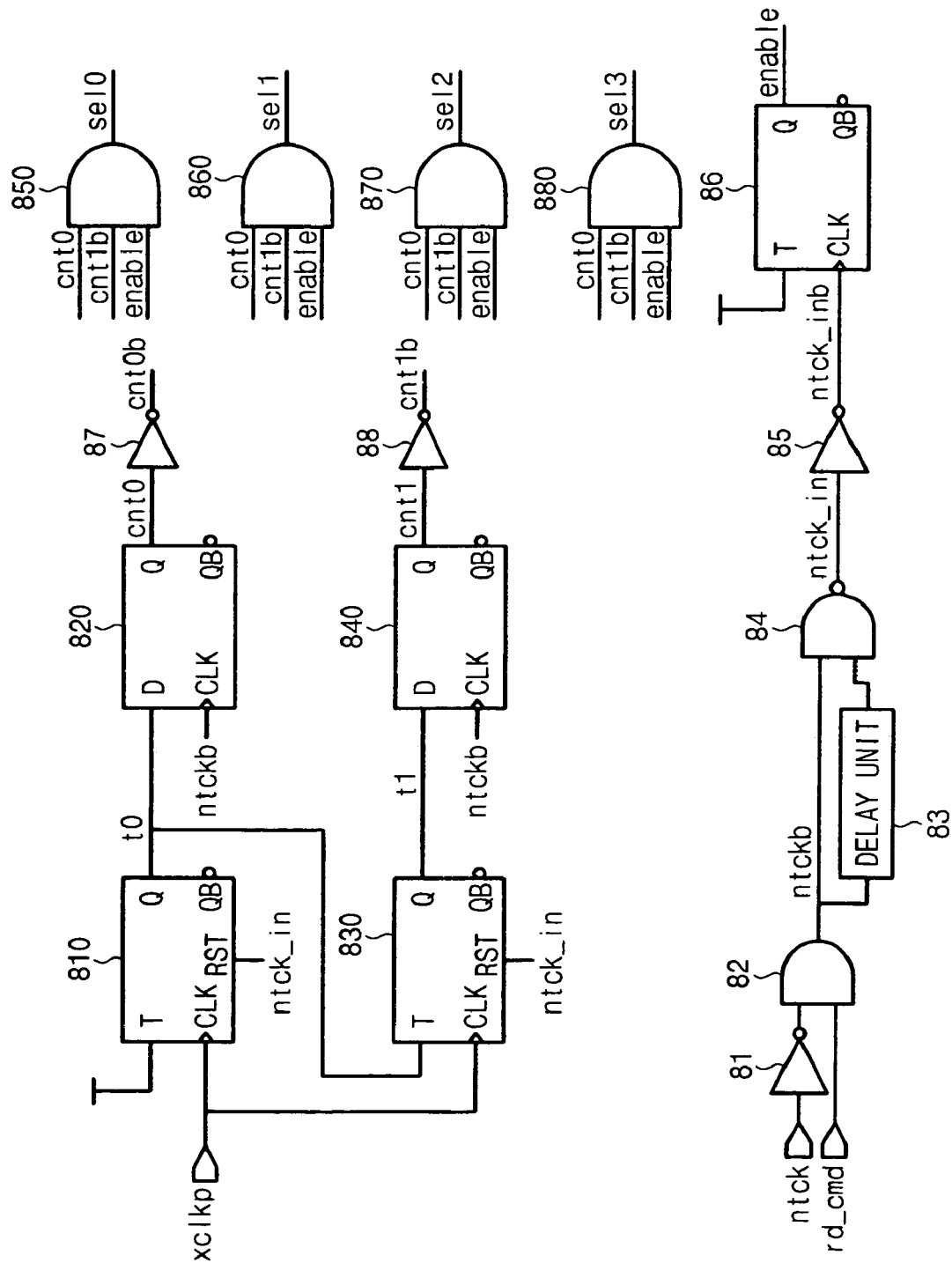
FIG. 8 is a circuit diagram illustrating the configuration of a control unit shown in FIG. 5 according to an embodiment of the present invention.

FIG. 8 is a circuit diagram illustrating the configuration of the control unit 520 shown in FIG. 5 according to an embodiment of the present invention.

The control unit shown in FIG. 8 includes a counter section and an initialization circuit 890.

The counter section includes T flip-flops 810 and 830, D flip-flops 820 and 840, and a plurality of NAND gates 850 to 880. The counter section selects one of multiple selection signals sel0 to sel3 based on the number of clocks of the signal xclkp. To be specific, the selection signal sel0 is enabled to a high level when the number of clocks of the signal xclkp is '1' (n=1), and the selection signal sel1 is enabled to a high level when the number of clocks of the signal xclkp is '2' (n=2). Similarly, the selection signal sel2 is enabled to a high level when the number of clocks of the signal xclkp is '3' (n=3), and the selection signal sel3 is enabled to a high level when the number of clocks of the signal xclkp is '4' (n=4).

The initialization circuit 890 includes an inverter 81 for receiving the signal ntck, an AND gate 82 for receiving the signal rd_cmd and the output signal of the inverter 81, a delay unit 83 for delaying the output signal ntckb of the AND gate 82, an NAND gate 84 for receiving the output signals of the AND gate 82 and the delay unit 83, an inverter 85 for receiving and inverting the output signal ntck_in of the NAND gate 84, and a T flip-flop 86 for receiving the output signal ntck_inb of the inverter 85 as a clock signal.

In the initialization circuit 890, when the signal rd_cmd is shifted to a high level, the NAND gate 84 outputs a pulse signal ntck_in of a high level. When the pulse signal ntck_in is in a high level, the T flip-flops 810 and 830 are reset, and the output 'enable' of the T flip-flop 86 has a low level. Thereafter, when a relevant counting ends (ntck=0), the T flip-flops 810 and 830 are again reset by the pulse signal ntck_in, and the output 'enable' of the T flip-flop 86 has a high level until a new pulse signal rd_cmd of a high level is applied.

As described above, the initialization circuit 890 repeats the above-mentioned procedure whenever a pulse signal rd_cmd of a high level is applied. Herein, in a period in which the signal ntck has a high level, the NAND gate 84 does not occur a pulse signal. For reference, in the initialization circuit 890, the output signal ntckb of the AND gate 82 functions to apply a counted value to the D flip-flops 820 and 840 when the signal ntck ends.

Figure 9A:
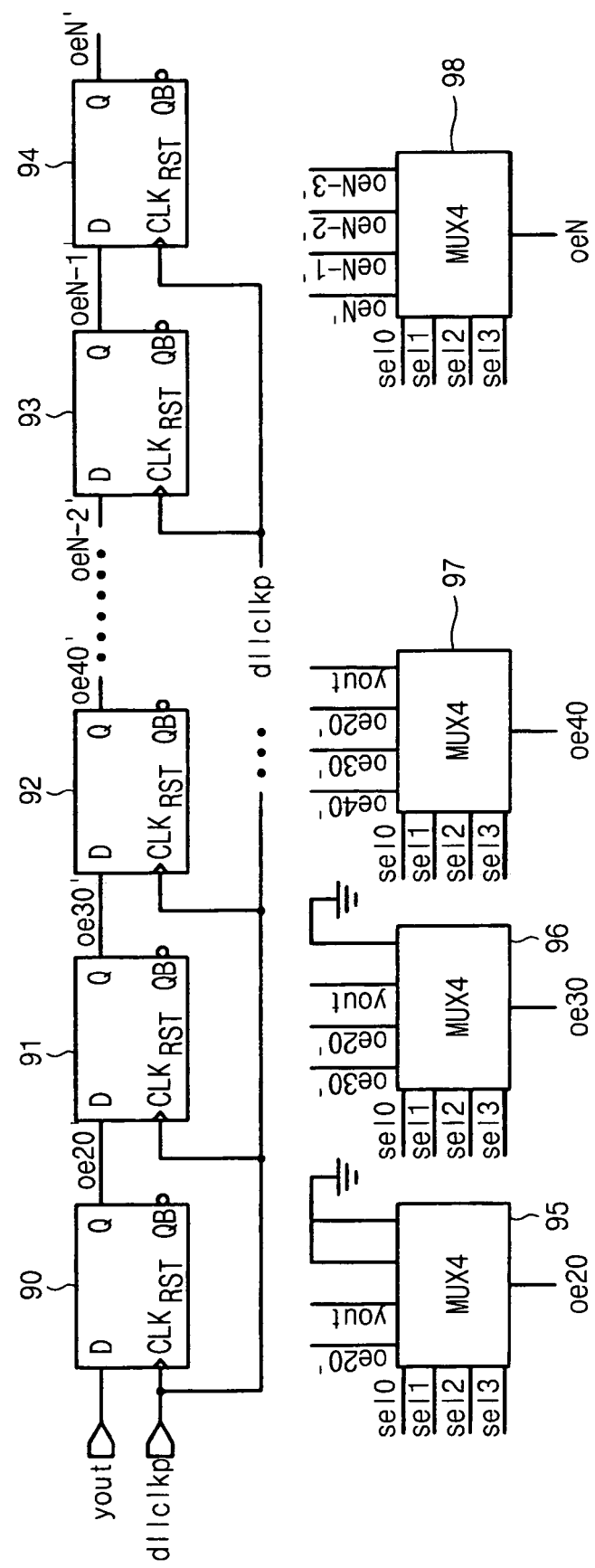
FIG. 9A is a circuit diagram illustrating the configuration of a data output control signal generation unit shown in FIG. 5 according to an embodiment of the present invention.

FIG. 9A is a circuit diagram illustrating the configuration of the data output control signal generation unit 530 shown in FIG. 5 according to an embodiment of the present invention.

The data output control signal generation unit shown in FIG. 9A includes a plurality of D flip-flops 90 to 94 and a plurality of multiplexers 95 to 98. For reference, the D flip-flops 90 to 94 shown in FIG. 9A may be replaced by other shift registers or the like having the same function as the D flip-flop.

The D flip-flops 90 to 94 transmits a signal applied to its input node 'D' to its output node 'Q' in synchronization with the rising edge of a DLL clock signal dllclkp.

That is, the signal yout is applied to the input node 'D' of the D flip-flop 90, and the applied signal yout is transferred to the output node 'Q' of the D flip-flop 90 in synchronization with the rising edge of a DLL clock signal dllclkp. In this case, the output signal of the D flip-flop 90 is expressed as oe20'.

The output signal oe20' of the D flip-flop 90 is applied to the input node 'D' of the D flip-flop 91, and the applied signal oe20' is transferred to the output node 'Q' of the D flip-flop 91 in synchronization with the rising edge of a DLL clock signal dllclkp. In this case, the output signal of the D flip-flop 91 is expressed as oe30'.

The output signal oe30' of the D flip-flop 91 is applied to the input node 'D' of the D flip-flop 92, and the applied signal oe30' is transferred to the output node 'Q' of the D flip-flop 92 in synchronization with the rising edge of a DLL clock signal dllclkp. In this case, the output signal of the D flip-flop 92 is expressed as oe40'.

In this way, the multiple D flip-flops 90 to 94 are connected in a cascade fashion.

The multiplexer 95 receives the output signal oe20' of the D flip-flop 90, the signal yout, and two ground signals via four input nodes.

The multiplexer 96 receives the output signal oe30' of the D flip-flop 91, the output signal oe20' of the D flip-flop 90, the signal yout, and a ground signal via four input nodes.

The multiplexer 97 receives the output signal oe40' of the D flip-flop 92, the output signal oe30' of the D flip-flop 91, the output signal oe20' of the D flip-flop 90, and the signal yout via four input nodes.

The multiplexer 98 receives four signals oeN', oe(N−1)', oe(N−2)' and oe(N−3)' via four input nodes. Herein, the signal oeN' is the output signal of the D flip-flop 94, and the signal oe(N−1)' is the output signal of the D flip-flop 93. Also, the signal oe(N−2)' is the output signal of a D flip-flop positioned directly before the D flip-flop 93, and the signal oe(N−3)' is the output signal of a D flip-flop positioned two stages before the D flip-flop 93.

The signals applied to each multiplexer 95 to 98 are outputted based on the selection signal sel0 to sel3.

For example, when the selection signal sel0 is enabled, the multiplexer 95 selects and outputs the signal oe20', the multiplexer 96 selects and outputs the signal oe30', the multiplexer 97 selects and outputs the signal oe40', the multiplexer 98 selects and outputs the signal oeN'.

The output signals of the multiplexers 95 to 98 are expressed as oe20, oe30, oe40, . . . , and oeN, respectively. The output signals oe20, oe30, oe40, . . . , and oeN are signals for controlling an enable timing of a data driver (not shown) for data output.

Figure 9B:
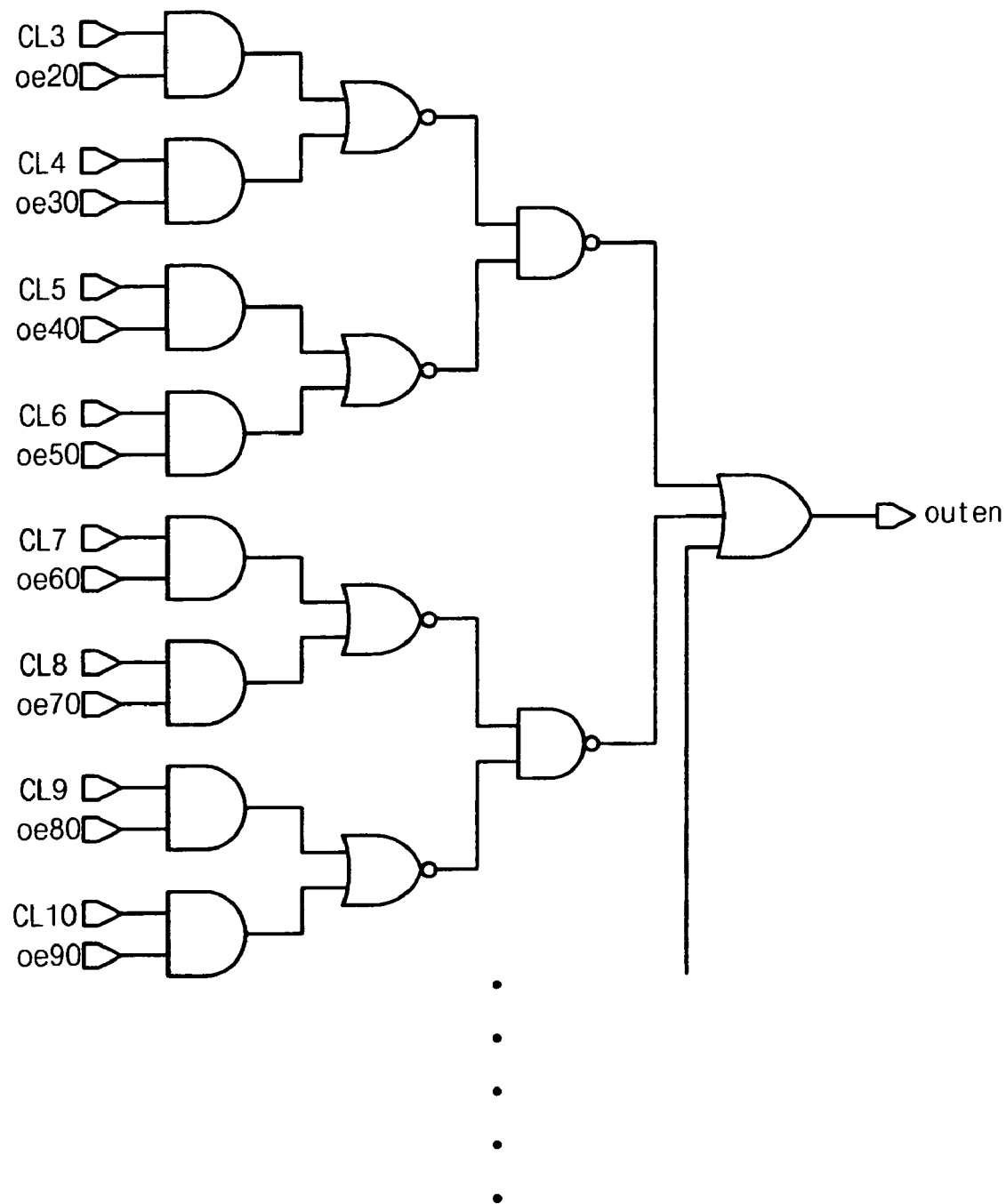
FIG. 9B is a circuit for selecting a final output enable signal to be applied to a data driver depending on CAS latency of the memory device according to an embodiment of the present invention.

FIG. 9B is a circuit for selecting a final output enable signal to be applied to a data driver (not shown) depending on the CAS latency CL of the memory device.

In FIG. 9B, all of the output signals oe20, oe30, . . . outputted from the circuit shown in FIG. 9A have a high level. Therefore, a final output enable signal 'outen' is determined by the CAS latency of the memory device.

For example, when the CAS latency is '4', only a CAS latency 'CL4' has a high level, and all of the other CAS latencies 'CL3', 'CL5', 'CL6', etc. have a low level. Therefore, the CAS latency 'CL4' and the output signal oe30 are selected and transmitted as a final output enable signal 'outen'.

FIG. 10 is a waveform diagram illustrating the waveform of an output enable signal depending on the CAS latency in the case in which n=2 and the CAS latency is '6' (CL=6).

When n is '2', as shown in FIG. 9A, the second input signals yout, oe20', oe30', oe40', oe50', etc. of each of the multiplexers 95 to 98 are selected by the selection signal sel1, so that signals oe20, oe30, oe40, oe50, oe6O, . . . , and oeN are outputted through the output nodes of the multiplexers 95 to 98.

Thereafter, as shown in FIG. 9B, since only the CL6 signal is enabled to a high level, the signal oe50 is selected and outputted to the output node. For reference, as shown in FIGS. 9A and 10, the signal oe50 is generated from the signal oe40'. Therefore, it can be understood that, when n is '2', the enable timing of the signal 'outen' determining the enable of the output driver can be advanced by one clock.

Although it is not shown, when n=3 and CL=6, the selection signal sel2 is enabled, so that the signal oe50 is generated by the signal oe30'. Therefore, in this case, it can be understood that the enable timing of the signal 'outen' determining the enable of the output driver can be advanced by two clocks.

As shown in FIG. 10, while the output signal 'outen' is maintained in an enable state, the output driver of the memory device outputs data to an exterior in synchronization with the rising edges and falling edges of the DLL clock signal dllclkp generated from the DLL circuit. Accordingly, it can be understood that data output starts at a time point at which the sixth pulse of an external clock signal is generated after a read command has been applied.

As described above, according to the circuit of the present invention, it is possible to adjust a data output timing in consideration of the operational frequency and the CAS latency of the memory device.

Therefore, the circuit according to the present invention enables stable data output even in high-frequency memory devices.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A device for controlling data output of a memory device using a DLL clock signal, the device comprising:
    an output driver for outputting data; and
    a CAS latency control unit, generating a signal adjusting an operation timing of the output driver depending on CAS latency, the CAS latency control unit comprising:
        a read command control unit generating first and second control signals, the first control signal being activated by a read command, the second control signal being generated in synchronization with a rising edge of a DLL clock signal generated after the first control signal;
        a delay unit, outputting a third control signal obtained by delaying the second control signal;
        a count signal generation unit which outputs fourth and fifth control signals, the fourth control signal having a pulse width enabled at a rising edge of the first control signal and disabled at a rising edge of the third control signal, the fifth control signal representing a count of the rising edges of the external clock during an enable period of the fourth control signal;
        a control unit for outputting a plurality of control signals using the fourth and fifth control signals; and
        a data output control signal generation unit that receives the second control signal and which outputs a plurality of output enable signals,
    wherein the first and second control signals and the plurality of output enable signals have substantially equal pulse widths, and one of the control signals outputted from the control unit is selected to select one of the output enable signals; and wherein the CAS latency control unit generates a signal for controlling the output driver by using time difference between the DLL clock signal and an external clock applied to the memory device from an exterior.

2. The device as claimed in claim 1, wherein one of the output enable signals is determined from CAS latency of the memory device.

3. The device as claimed in claim 1, wherein the plurality of output enable signals are sequentially generated.

4. A memory device comprising:

an output driver for outputting data; and a CAS latency control unit that generates a signal that adjusts timing of the output driver depending on CAS latency, the CAS latency control unit comprising:

a read command control unit for a first control signal and a second control signal, the first control signal being internally activated by a read command applied in synchronization with a rising edge of the external clock, the second control signal being generated in synchronization with a rising edge of the DLL clock signal which is generated for the first time after the first control signal has been activated;

a delay unit for outputting a third control signal obtained by delaying the second control signal by a predetermed period of time;

a count signal generation unit for outputting a fourth control signal and a fifth control signal, the fourth control signal having a pulse width to be enabled at a rising edge of the first control signal and to be disabled at a rising edge of the third control signal, the fifth control signal counting the number of rising edges of the external clock during an enable period of the fourth control signal;

a control unit for outputting a plurality of control signals by using the fourth and fifth control signals; and a data output control signal generation unit for receiving the second control signal and outputting a plurality of output enable signals, wherein the first and second control signals and the plurality of output enable signals have an equal pulse width, and one of the control signals outputted from the control unit is selected to select one of the output enable signals.

5. The memory device of claim 4, wherein selecting one of the output enable signals is determined depending on the CAS latency of the memory device.

6. The memory device of claim 4, wherein the plurality of output enable signals are sequentially generated in synchronization with rising edges of the DLL clock signal, and delay of a time point for generating the selected output enable signal increases as the CAS latency of the memory device increases.

7. The memory device of claim 4 wherein the memory device is a double data rate (DDR) random access memory.

* * * * *